United States Patent
Lemettre

(10) Patent No.: US 11,685,645 B2
(45) Date of Patent: Jun. 27, 2023

(54) MICRO-ELECTROMECHANICAL SYSTEM AND METHOD FOR PRODUCING SAME

(71) Applicant: LYNRED, Palaiseau (FR)

(72) Inventor: Sylvain Lemettre, Massy (FR)

(73) Assignee: LYNRED, Palaiseau (FR)

( * ) Notice: Subject to any disclaimer, the term of this patent is extended or adjusted under 35 U.S.C. 154(b) by 0 days.

(21) Appl. No.: 17/913,956

(22) PCT Filed: Apr. 8, 2021

(86) PCT No.: PCT/EP2021/059150
§ 371 (c)(1),
(2) Date: Sep. 23, 2022

(87) PCT Pub. No.: WO2021/223951
PCT Pub. Date: Nov. 11, 2021

(65) Prior Publication Data
US 2023/0123544 A1    Apr. 20, 2023

(30) Foreign Application Priority Data

May 7, 2020  (FR) ...................... 2004519

(51) Int. Cl.
*B81C 1/00*   (2006.01)
*B81B 7/00*   (2006.01)
*H01L 23/26*  (2006.01)

(52) U.S. Cl.
CPC ............ *B81B 7/0038* (2013.01); *H01L 23/26* (2013.01); *B81C 1/00285* (2013.01); *B81C 2203/0145* (2013.01)

(58) Field of Classification Search
None
See application file for complete search history.

(56) References Cited

U.S. PATENT DOCUMENTS

| 5,701,008 A | 12/1997 | Ray et al. |
| 6,923,625 B2 | 8/2005 | Sparks |

(Continued)

FOREIGN PATENT DOCUMENTS

| EP | 2897162 A1 | 7/2015 |
| WO | WO-2020008125 A1 | 1/2020 |

OTHER PUBLICATIONS

Search Report and Written Opinion issued in PCT Application No. PCT/EP2021/059150, dated Jun. 11, 2021.

(Continued)

*Primary Examiner* — Benjamin P Sandvik
(74) *Attorney, Agent, or Firm* — Marshall, Gerstein & Borun LLP

(57) ABSTRACT

A method of manufacturing a microelectromechanical system includes forming of an electromechanical element on a substrate. The method further includes preparation of an encapsulation package to form a sealed cavity integrating the electromechanical element, with the sealed cavity having a volume smaller than 10 mm$^3$. The method includes physical vapor deposition of a getter film on the substrate or on a wall of the encapsulation package so that the getter film has a specific absorption surface area smaller than 8 m$^2$/g, and sealing of the encapsulation package on the substrate by means of a thermal sealing cycle having a temperature enabling to activate said getter film.

11 Claims, 1 Drawing Sheet

(56) References Cited

U.S. PATENT DOCUMENTS

| | | |
|---|---|---|
| 7,789,949 B2 | 9/2010 | Sparks et al. |
| 7,871,660 B2 | 1/2011 | Moraja et al. |
| 7,998,319 B2 | 8/2011 | Guadagnuolo et al. |
| 9,005,353 B2 | 4/2015 | Caplet |
| 9,051,173 B2 | 6/2015 | Baillin et al. |
| 9,240,362 B2 | 1/2016 | Chidambaram et al. |
| 9,511,998 B2 | 12/2016 | Samarao et al. |
| 9,637,377 B2 | 5/2017 | Reinert et al. |
| 10,414,647 B2 * | 9/2019 | Favier ................. B81C 1/00269 |
| 2006/0197428 A1 * | 9/2006 | Tonegawa ............... H01J 9/241 |
| | | 313/310 |
| 2009/0261464 A1 | 10/2009 | Alie |
| 2014/0175590 A1 | 6/2014 | Gooch et al. |
| 2016/0040282 A1 | 2/2016 | Gooch et al. |
| 2017/0081176 A1 * | 3/2017 | Ji .......................... B81B 7/0038 |

OTHER PUBLICATIONS

Charvet al., "MEMS packaging reliability assessment: Residual Gas Analysis of gaseous species trapped inside MEMS cavities". Science Direct, Microelectronics Reliability. Retrieved from the Internet at: ><https://www.sciencedirect.com/science/article/abs/pii/S0026271413001960?via%3Dihub> on Jul. 21, 2013.

Rouquerol et al., "Texture of Divided Materials Specific Surface Area of Powders or Nanporous Materials", Analytical Techniques, Article Interactif. Ref: P1050 v4. May 10, 2017.

Tenchine et al., "Effect Getter of Multilayers for Applications MEMS.Study of the Relation Eleboration—Microstructure—Behavior", University of Grenoble. NNT: 2011GRENI026. Jul. 18, 2011.

* cited by examiner

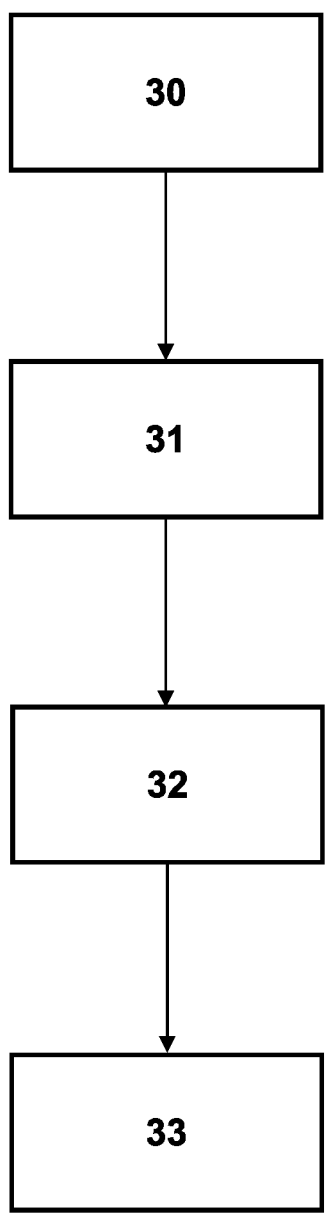
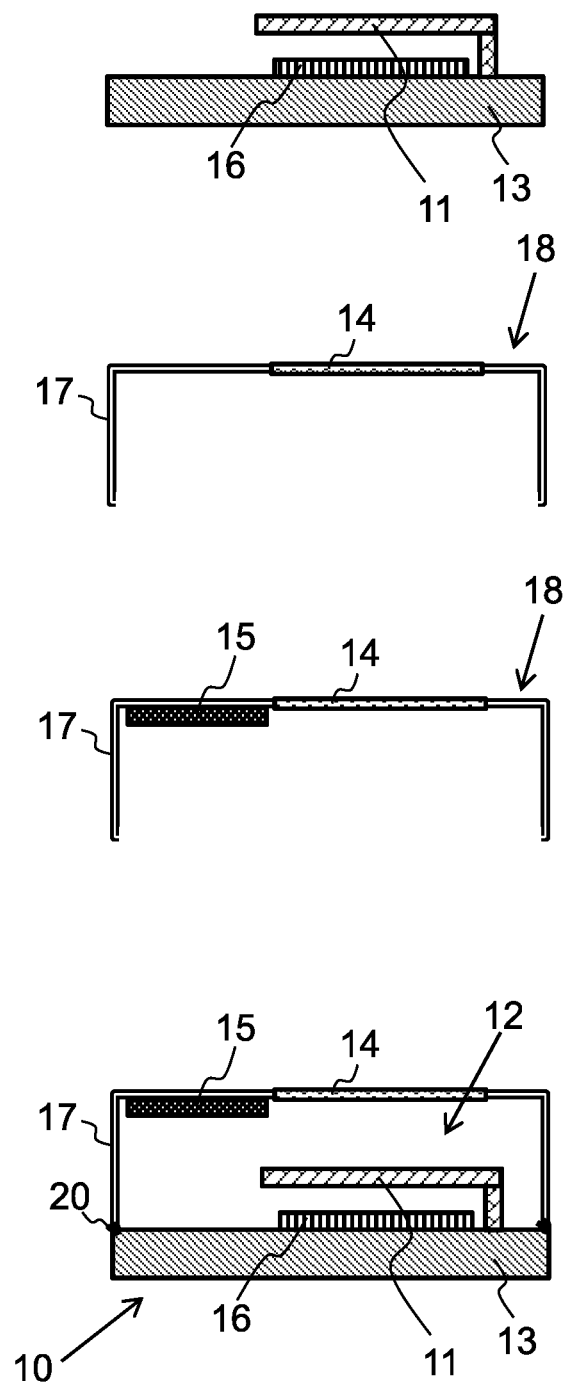

MICRO-ELECTROMECHANICAL SYSTEM AND METHOD FOR PRODUCING SAME

FIELD OF TECHNOLOGY

The invention concerns a method of manufacturing a microelectromechanical system, also called MEMS in literature.

More particularly, the invention aims at the manufacturing of a MEMS encapsulated under vacuum in a sealed package of low volume, typically having a volume smaller than 10 mm$^3$.

The invention may be applied to a plurality of types of microelectromechanical systems requiring an encapsulation under vacuum with a low volume, for example, the microbolometers of uncooled infrared imagers.

BACKGROUND

Certain microsystems have to operate under vacuum to achieve an optimal performance. This is particularly true for the MEMSs used in uncooled infrared imagers: microbolometers.

A microbolometer is formed of an absorber sensitive to incident infrared radiations in a spectral range of interest, typically in the range from 8 to 14 micrometers. The absorber is coupled to a thermistor, having the function of measuring the heating of the absorber. The thermistor has a resistance which varies when its changes temperature. Thus, the thermistor converts the temperature variation of the absorber into a resistance variation. Further, the thermistor is coupled to a readout circuit which measures this resistance variation. By collecting the resistance variations of an array of microbolometric pixels, an infrared image is generated by means of the readout circuit.

To maximize the temperature rise of the absorber, thermal losses have to be decreased to a minimum, whereby the need for a function of thermal insulation between the readout circuit and the detection function ensured by the thermistor.

For this purpose, the microbolometer appears in the form of a structure suspended above the readout circuit, called "plate", which ensures the absorption and detection functions. The plate is coupled to the readout circuit by suspension arms. This suspended design addresses optical, mechanical, and above all thermal imperatives.

Indeed, by placing this suspended structure in an enclosure under a low-pressure rarefied atmosphere, the volume of empty space between the plate and a substrate integrating the readout circuit forms an excellent thermal insulator.

The three main thermal loss phenomena of a suspended structure are the solid conduction through the arms coupling the plate to the readout circuit, the conduction through the gas surrounding the plate, and radiation. At the temperatures of use of a microbolometer, the thermal transfer by radiation is negligible. The solid conduction is determined by the geometry of the suspended structure. The thermal transfer by the gas is minimized by lowering the gas pressure between the bolometric plate and the readout circuit, until it is lower than the solid conduction.

The thermal insulation indispensable for the optimal operation of a microbolometer is thus achieved by placing the microbolometer under vacuum. A pressure lower than approximately $10^{-2}$ mbar is necessary to obtain a maximum sensitivity.

To reach such a vacuum level, the array of microbolometric pixels is encapsulated under vacuum in a cavity. This encapsulation conventionally requires the use of a sealed metallic sealing technique to maintain the desired vacuum level all along the lifetime of the component.

However, forming a metal welding implies heating the system, which causes the desorption of the gas molecules trapped in or on the cavity walls. Further, when the cavity is sealed, the gas of the cavity can no longer be discharged by an external pumping system. A specific device for absorbing this gas thus has to be present in the cavity. This device is called "getter".

It is a thin metal film deposited in the cavity of the MEMS. It is initially passivated by its native oxide, but when it is heated, the diffusion of this surface layer into the volume makes its surface reactive. It then traps the gas species present in its environment, thus lowering the cavity pressure. The getter is then said to be "activated". The level of vacuum reached in a cavity is thus controlled by the quantity of gas molecules absorbed by the getter film. This quantity depends on:

- the intrinsic properties of the getter: the chemical nature of the thin film, its microstructure, and the surface of the deposit; and
- the getter activation conditions: they are determined by the sealing cycle, since the thermal heating of the metallic sealing method is conventionally used to activate the getter film, in order to decrease the production cost.

To operate, the active getter must simply be in contact with the gas to be absorbed. The getter film is thus indistinctively deposited on the unused areas of the MEMS substrate, or on the walls of the encapsulation package, continuously or discontinuously.

The constant search for a miniaturization of MEMSs causes a decrease in the cavity volumes. The ratio of the surface area of the walls to the volume of the cavity being increasing with the volume decrease, the partial pressure of the gases desorbed into the cavity is also increasing. Increasingly efficient getters thus have to be implemented.

To elaborate a functional getter, that is, capable of absorbing all the molecules desorbed into the cavity of a MEMS during the sealing, there exist a plurality of different solutions capable of being implemented for cavities of small volumes.

A solution, described in document U.S. Pat. No. 7,998,319, comprises using a porous getter film by depositing said film by cathode sputtering. The porosity of the getter film enables to improve the efficiency of the getter by creating micro-channels inside of which the molecules can be captured by the getter film.

Another known getter film deposition method is physical vapor deposition. However, for small cavity volumes, document U.S. Pat. No. 7,998,319 indicates that this deposition method is inappropriate, mainly due to the fact that the deposited films become compact, and thus do not have the large effective surface area and high porosity characteristics necessary for the proper operation of the getter.

Other solutions provide increasing the effective surface area of the getter film by performing a deposition of said film with a textured surface. For example, these solutions are used in documents U.S. Pat. Nos. 7,789,949, 5,701,008, US 2014/0175590, U.S. Pat. Nos. 6,923,625, 9,637,377, 9,511,998, US 2009/0261464, EP 2 897 162, or U.S. Pat. No. 7,871,660.

This porosity may also be obtained by a film deposited on a sub-layer, such as described in documents US 2016/0040282 or U.S. Pat. No. 9,005,353. In these solutions, since the getter films must have a large effective surface area, the privileged deposition method to elaborate them is cathode sputtering, since it enables to obtain porous films.

Further, to minimize the desorption of gases during the sealing and thus limit the efficiency constraints of the getter material, document U.S. Pat. No. 9,240,362 provides performing a degassing anneal under vacuum at a temperature lower than that of activation of the getter prior to the sealing of the cavity.

However, this method lengthens the cycle time and it is only applicable to restricted cases of encapsulation method. Indeed, if the getter is exposed again to ambient air between its pre-anneal and the sealing cycle, its porous surface traps gas again: the degassing is thus not efficient. However, if the degassing anneal is performed in the sealing furnace, and the anneal is immediately followed by the sealing cycle, then the sealing beads of the cavity also are necessarily submitted to the pre-degassing anneal. Now, this may degrade the quality of the welding, in particular for low-temperature sealing techniques, typically close to 250° C. The pre-degassing in the sealing furnace can thus only be implemented with techniques of sealing at high temperature, typically higher than 350° C., for which the quantity of gases desorbed into the cavity during the sealing is significant.

These solutions of the state of the art do not enable to achieve a very high vacuum level, typically $5.10^{-2}$ mbar, for cavities of very small volumes, for example, close to 1 mm$^3$.

The technical issue that the present invention aims at solving thus is to determine how to obtain a very high vacuum level by decreasing the volume of a cavity of a MEMS while using the simplest possible manufacturing method.

SUMMARY

The invention originates from a first observation according to which argon is the gas which limits the vacuum level capable of being reached by solutions of the state of the art. To reach this observation, the gases desorbed into a MEMS cavity, particularly that of a microbolometer, have been analyzed after the sealing of the cavity. This analysis has shown that the desorbed gases are mainly formed of hydrogen, nitrogen, carbon oxides, and of compounds of carbon and hydrogen, such as methane.

Against all expectations, this analysis has also revealed a high quantity of argon.

Now, among these gases, the only gas which cannot be captured by the getter is argon and this gas is highly used in methods of micro-manufacturing in a clean room. Thus, after the sealing of the cavity, each desorbed argon atom irremediably increases the pressure in the cavity.

Based on this observation, it has been searched for all argon trapping sources in the substrate or the cavity walls capable of desorbing argon after the sealing of the cavity. It has been observed that the method of getter deposition by cathode sputtering causes the incorporation of argon into the getter film on deposition thereof. Further, the much desired porosity of getter films also causes a trapping of the argon molecules present in the air.

The invention also originates from a second observation according to which it is possible to absorb all the gas molecules other than argon, degassed into a cavity of small volume with specific surface areas as small as those obtained by a non-porous deposition, as simply obtained as by evaporation on a planar and non-textured substrate.

To address the technical issue, the invention provides using a MEMS manufacturing method where the getter film is deposited by a physical vapor deposition to limit the incorporation of argon during the deposition of the getter film. Further, this deposition technique enables to obtain a very slightly porous getter film limiting the capture of the argon present in the air.

For this purpose, according to a first aspect, the invention concerns a microelectromechanical system manufacturing method comprising the following steps:

forming of an electromechanical element on a substrate;
preparation of an encapsulation package to form a sealed cavity integrating said electromechanical element, said sealed cavity having a volume smaller than 10 mm$^3$;
physical vapor deposition of a getter film on said substrate or on a wall of the encapsulation package so that the getter film has a specific absorption surface area smaller than 8 m$^2$/g; the getter film being deposited on the substrate in the absence of any previous cleaning of said substrate involving a noble gas; and
sealing of the encapsulation package on the substrate by means of a thermal sealing cycle having a temperature enabling to activate said getter film.

In the sense of the invention, the "specific absorption surface area" is measured by the method called BET, for Brunauer, Emmett, and Teller, such as described in Françoise ROUQUEROL, Jean ROUQUEROL, Isabelle BEURROIES, Philip LLEWELLYN, and Renaud DENOYEL's scientific publication, "*Texture des matériaux divisés—Aire spécifique des matériaux pulvérulents ou nanoporeux*", Techniques de l'Ingenieur, reference P1050, 2017. This method enables to measure the specific surface area of absorption of a quantity of gas to determine the porosity of a solid.

According to the invention, the expression "specific absorption surface area" describes both the absorption capacity and the adsorption capacity of the solid, that is, the capacity of a solid of allowing the penetration of a gas species and the capacity of a solid of fixing a gas species onto its surface.

Further, this specific absorption surface area smaller than 8 m$^2$/g makes the desorption of argon into the cavity negligible due to the presence of the getter. Thus, it is possible to estimate the specific absorption surface area of the getter film by analyzing the argon desorption of the getter film.

To achieve this, it is possible to use an analysis of the residual gases, such as described in P.-L. Charvet, P. Nicolas, D. Bloch, B. Savornin's scientific publication, "*MEMS packaging reliability assessment Residual Gas Analysis*", Microelectronics Reliability 53 (2013) 1622-1627. This type of analysis consists in placing a cavity to be analyzed in an enclosure under ultra-high vacuum. By piercing the cavity present in the enclosure, it is possible to measure the volume and the nature of all the gases extracted from the enclosure as a result of the piercing of the cavity.

By heating a MEMS for 30 minutes at a 300° C. temperature, it is possible to force a significant desorption of argon from the substrate and the walls of a cavity.

It is thus possible to measure the quantity of gases desorbed after this heating step for a MEMS integrating a getter film and for the same MEMS comprising no such getter film. If the argon proportion difference measured between the two MEMSs is smaller than 10%, the argon desorbed by the getter film is considered as negligible as compared with the argon desorbed by the substrate and the cavity walls, and it is possible to conclude that the getter film has a specific absorption surface area smaller than 8 m$^2$/g.

The physical vapor deposition of the getter film, such that the getter film has a specific absorption surface area smaller than 8 m²/g, thus enables to obtain a cavity with a small quantity of argon. Since the other gases can be captured by the getter film, the invention enables to improve the vacuum level capable of being reached in a cavity of small volume.

The invention thus challenges the above-discussed technical prejudice according to which the $10^{-2}$-mbar vacuum level can be reached in a cavity of small volume of a MEMS only by forming a porous getter or by structuring the getter surface. Indeed, the physical vapor deposition of a getter film enables to obtain a $5.10^{-2}$-mbar vacuum level in cavities of very small volume, for example, smaller than 2 mm³, since this deposition technique limits the incorporation of argon during the deposition and enables to obtain a very slightly porous getter film, limiting the trapping of the argon atoms present in the air during the inevitable exposure of the getter to ambient air.

The invention is thus particularly advantageous for MEMSs integrating microbolometers, for which the vacuum level is essential to maintain their performance over time.

Further, certain manufacturing techniques implement a cleaning of the substrate with an argon plasma before depositing the getter film on the substrate. It has been observed that this technique causes the absorption of argon into the substrate before the sealing. To limit the desorption of argon during the sealing, the getter film is deposited on the substrate with no previous cleaning of the substrate involving a noble gas.

Preferably, the physical vapor deposition of the getter film is performed by heating a crucible containing the evaporation charges by Joule effect or due to an electron beam, under a pressure lower than $10^{-7}$ mbar to limit the quantity of argon incorporated into the getter layer.

Preferably, the sealing is performed at a temperature in the range from 250 to 350° C., typically 300° C. By using a sealing temperature close to 300° C., it is possible to use tried and tested methods to obtain the sealing and the activation of the getter.

Preferably, the getter comprises at least one of the following elements: Baryum, Lanthanum, Scandium, Titanium, Zirconium, Niobium, Yttrium, Vanadium, Hafnium, Tantalum, Iron, Cobalt, Nickel, Palladium, Platinum, and Aluminum, alone or in a mixture.

For example, high-performance results have been obtained with a getter made of a Titanium-Yttrium alloy. Indeed, a $3.10^{-2}$-mbar vacuum has been obtained for a 1-mm³ cavity sealed at 300° C.

According to a second aspect, the invention concerns a microelectromechanical system comprising:
 a substrate supporting an electromechanical element;
 an encapsulation package attached to said substrate to form a sealed cavity integrating said electromechanical element; and
 a getter film deposited in the sealed cavity on the substrate or on a wall of the encapsulation package;
 the sealed cavity having a volume smaller than 10 mm³;
 the getter film having a specific absorption surface area smaller than 8 m²/g; the getter film being deposited on the substrate in the absence of any previous cleaning of said substrate involving a noble gas.

The specific absorption surface area of the getter film smaller than 8 m²/g is preferably obtained by the previously-described physical vapor deposition.

For example, this specific absorption surface area may be obtained by evaporation along an axis which is normal or slightly inclined, that is, with an angle smaller than 40°, with respect to the substrate. The substrate is then rotated on itself around the evaporation axis during the evaporation of the getter material to form a getter film with the described specific absorption surface area.

According to another example, this specific absorption surface area may be obtained by cathode sputtering. The carrier gas pressure is then determined according to the nature of the getter film to be sputtered and to the power of the plasma. The substrate is then rotated on itself around the evaporation axis during the evaporation of the getter material to form a getter film with the described specific absorption surface area.

As a variant, any other deposition enabling to obtain a specific absorption surface area smaller than 8 m²/g may be used.

Observations have shown that the argon degassing due to the exposure to ambient air and to the trapping of argon in the pores of the getter is linked to the specific absorption surface area. Thus, a measurement of the specific absorption surface area enables to know whether the argon trapping phenomenon could or not occur according to the specific absorption surface area characteristic of a specific getter.

BRIEF DESCRIPTION OF THE DRAWINGS

The way to implement the present invention, as well as the resulting advantages, will better appear from the description of the following non-limiting embodiments, given as an indication, based on the accompanying drawing:

FIG. 1 is a flowchart of the steps of the microelectromechanical system manufacturing method according to an embodiment of the invention.

DETAILED DESCRIPTION

In the rest of the description, the invention will be described in reference to an optoelectronic component 10, although the invention may also apply to other MEMS devices without changing the invention.

FIG. 1 illustrates the steps of forming of an optoelectronic component 10 encapsulated in an enclosure 12 under a predetermined pressure, for example, under a pressure lower than $5.10^{-2}$ mbar. Enclosure 12 is formed by sealing of lateral walls 17 of a sealed package 18 on a substrate 13 by means of a metal seal 20.

To achieve this, a first step 30 comprises forming electromechanical element 11 on substrate 13. For example, substrate 13 may integrate a readout circuit and electromechanical element 11 may correspond to an uncooled microbolometer mounted in suspension above substrate 13 by means of pads and of support arms. To achieve this, one or a plurality of sacrificial layers are used and are structured to form the pads and the different layers of the microbolometer membrane. Further, under this membrane, microbolometer 11 may comprise a reflector 16.

In parallel with this first step 30, a second step 31 comprises preparing an encapsulation package 18 intended to form a sealed cavity 12 around electromechanical element 11. To achieve this, lateral walls 17 are structured substantially vertically in line with a substrate intended to form the top of encapsulation package 18. An optical window 14 may also be structured in this upper substrate to filter the electromagnetic radiation captured by microbolometer 11.

After this second step 31, a third step 32 comprises depositing a getter film 15 on substrate 13 or on a wall of encapsulation package 18. As illustrated in FIG. 1, getter film 15 may be deposited next to optical window 14 on the upper wall of encapsulation package 18. As a variant, getter film 15 may be deposited next to reflector 16 or on lateral walls 17.

In all cases getter film 15 is intended to be arranged inside of enclosure 12 to capture the gases desorbed into said enclosure, and to maintain a vacuum level smaller than $5.10^{-2}$ mbar therein.

According to the invention, this getter film 15 is deposited by physical vapor deposition to obtain a specific absorption surface area smaller than 8 m$^2$/g. Preferably, the deposition surface of this getter film 15 is not cleaned by a method involving argon before the deposition of getter film 15 to avoid the incorporation of argon into the wall of encapsulation package 18 or on substrate 13.

Preferably, getter film 15 comprises at least one of the following elements Baryum, Lanthanum, Scandium, Titanium, Zirconium, Niobium, Yttrium, Vanadium, Hafnium, Tantalum, Iron, Cobalt, Nickel, Palladium, Platinum, and Aluminum, alone or in a mixture. For example, getter film 15 may be made of a Titanium-Yttrium alloy.

The physical vapor deposition of getter film 15 consists in heating a crucible integrating the getter material to obtain its evaporation. This evaporation is performed under vacuum, preferably at a pressure lower than $10^{-7}$ mbar. The evaporation of the getter material is controlled by an electric current or an electron beam so that the evaporated particles of the getter material agglomerate on the target surface, that is, on a surface of substrate 13 or of a wall of encapsulation package 18. To achieve this, the evaporation by Joule effect consists in heating the crucible with an electric current while the electron beam evaporation consists in applying an electron beam directed onto the crucible.

When getter film 15 is deposited on substrate 13 or on a wall of encapsulation package 18, said package may be sealed to substrate 13, during a step 33. To achieve this, a metallic weld bead 20 is deposited between substrate 13 and the lower end of the lateral walls 17 of encapsulation package 18. This weld bead 20 is then heated to obtain a sealed surface between the lower end of the lateral walls 17 of encapsulation package 18 and substrate 13.

The heating temperature of this weld bead 20 is preferably in the range from 250 to 350° C., to allow an activation of getter film 15 during the temperature rise of weld bead 20. A very simple thermal sealing cycle may be implemented: a first temperature rise phase, a second phase of temperature stabilization at the heating temperature for a predetermined duration, and a third phase of progressive temperature decrease. During this sealing cycle, the stabilization time as well as the temperature rise and fall times may be adjusted according to the getter material and to the material of weld bead 20 to obtain an efficient activation of getter film 15 and a sealed welding of enclosure 12. Further, it is also possible to use more complex sealing cycles with degassing stages.

The activation of the getter film is obtained by means of a migration of the passivation layer formed at the surface of getter film 15 after the contact between the getter film and oxygen. This passivation layer may correspond to a nitride layer if a specific anneal method has been used, as described in document U.S. Pat. No. 9,051,173, or to a thin gold, palladium, or nickel layer, as described in documents U.S. Pat. Nos. 6,923,625 and 9,240,362.

These different micro-manufacturing steps enable to obtain an enclosure 12 with a very low argon level, since these steps limit the desorption of argon into cavity 12. Further, the getter film 15 deposited by evaporation enables to absorb all the gas molecules degassed into cavity 12. Thereby, it is possible to obtain a vacuum level smaller than $5.10^{-2}$ mbar in a sealed cavity 12 having a volume smaller than 2 mm$^3$, typically a cavity 12 with a volume of approximately 1 mm$^3$.

The invention thus enables to obtain a microelectromechanical system 10 with a sealed cavity 12 of very small volume and with a high vacuum level.

The invention claimed is:

1. A method of manufacturing a microelectromechanical system, comprising the following steps:
    forming of an electromechanical element on a substrate;
    preparation of an encapsulation package to form a sealed cavity integrating said electromechanical element, said sealed cavity having a volume smaller than 10 mm$^3$;
    physical vapor deposition of a getter film on said substrate or on a wall of the encapsulation package so that the getter film has a specific absorption surface area smaller than 8 m$^2$/g; the getter film being deposited on the substrate in the absence of any previous cleaning of said substrate involving a noble gas; and
    sealing of the encapsulation package on the substrate by means of a thermal sealing cycle having a temperature enabling to activate the getter film.

2. The microelectromechanical system manufacturing method according to claim 1, wherein the physical vapor deposition of the getter film is performed at a pressure lower than $10^{-7}$ mbar.

3. The microelectromechanical system manufacturing method according to claim 1, wherein the sealing is performed at a temperature in the range from 250° C. to 350° C.

4. The microelectromechanical system manufacturing method according to claim 1, wherein the getter film comprises at least one of the following elements: Baryum, Lanthanum, Scandium, Titanium, Zirconium, Niobium, Yttrium, Vanadium, Hafnium, Tantalum, Iron, Cobalt, Nickel, Palladium, Platinum, and Aluminum, alone or in a mixture.

5. The microelectromechanical system manufacturing method according to claim 4, wherein the getter film is made of a Titanium-Yttrium alloy.

6. A microelectromechanical system comprising:
    a substrate supporting an electromechanical element;
    an encapsulation package attached to said substrate to form a sealed cavity integrating said electromechanical element; and
    a getter film deposited in the sealed cavity on said substrate or on a wall of said encapsulation package; wherein
    the sealed cavity has a volume smaller than 10 mm$^3$;
    and the getter film has a specific absorption surface area smaller than 8 m$^2$/g; the getter film being deposited on the substrate in the absence of any previous cleaning of said substrate involving a noble gas.

7. The micro-electromechanical system according to claim 6, wherein the getter film comprises at least one of the following elements: Baryum, Lanthanum, Scandium, Titanium, Zirconium, Niobium, Yttrium, Vanadium, Hafnium, Tantalum, Iron, Cobalt, Nickel, Palladium, Platinum, and Aluminum, alone or in a mixture.

8. The microelectromechanical system according to claim 7, wherein the getter film is made of a Titanium-Yttrium alloy.

9. The microelectromechanical system according to claim 6, wherein the sealed cavity has a vacuum level smaller than $5.10^{-2}$ mbar.

10. The microelectromechanical system according to claim 6, wherein the sealed cavity has a volume smaller than 2 mm$^3$.

11. The microelectromechanical system according to claim 6, wherein the electromechanical element corresponds to at least one microbolometer.

* * * * *